US012522921B2

(12) United States Patent
Kim et al.

(10) Patent No.: US 12,522,921 B2

(45) Date of Patent: Jan. 13, 2026

(54) YTTRIUM/LANTHANIDE METAL PRECURSOR COMPOUND, COMPOSITION FOR FORMING FILM INCLUDING THE SAME, AND METHOD OF FORMING YTTRIUM/LANTHANIDE METAL-CONTAINING FILM USING THE SAME

(71) Applicant: UP CHEMICAL CO., LTD., Pyeongtaek-si (KR)

(72) Inventors: Jin Sik Kim, Pyeongtaek-si (KR); Myeong-Ho Park, Suwon-si (KR); Dong Hwan Ma, Seoul (KR); Yun Gyeong Yi, Guri-si (KR); Jun Hwan Choi, Goyang-si (KR)

(73) Assignee: UP CHEMICAL CO., LTD., Pyeongtaek-si (KR)

( * ) Notice: Subject to any disclaimer, the term of this patent is extended or adjusted under 35 U.S.C. 154(b) by 190 days.

(21) Appl. No.: 17/848,455

(22) Filed: Jun. 24, 2022

(65) Prior Publication Data

US 2022/0325411 A1 Oct. 13, 2022

Related U.S. Application Data

(63) Continuation of application No. PCT/KR2020/019058, filed on Dec. 24, 2020.

(30) Foreign Application Priority Data

Dec. 27, 2019 (KR) ........................ 10-2019-0176737

(51) Int. Cl.

*C23C 16/455* (2006.01)

*C23C 16/04* (2006.01)

(Continued)

(52) U.S. Cl.

CPC ...... *C23C 16/45553* (2013.01); *C23C 16/045* (2013.01); *C23C 16/32* (2013.01); *C23C 16/34* (2013.01); *C23C 16/405* (2013.01)

(58) Field of Classification Search

CPC . C23C 16/45553; C23C 16/045; C23C 16/32; C23C 16/34; C23C 16/405

See application file for complete search history.

(56) References Cited

U.S. PATENT DOCUMENTS

2016/0293409 A1* 10/2016 Pallem .................... C23C 16/18

2016/0315168 A1 10/2016 Dussarrat (Continued)

FOREIGN PATENT DOCUMENTS

JP 2006-511716 A 4/2006

JP 2011-522833 A 8/2011

(Continued)

OTHER PUBLICATIONS

International Search Report of PCT/KR2020/019058 dated Apr. 5, 2021.

*Primary Examiner* — Kelly M Gambetta

(74) *Attorney, Agent, or Firm* — Shih IP Law Group, PLLC.

(57) ABSTRACT

The present disclosure relates to an yttrium/lanthanide metal precursor compound, a precursor composition for depositing an yttrium/lanthanide metal-containing film including the yttrium/lanthanide metal precursor compound, and a method of depositing the yttrium/lanthanide metal-containing film using the precursor composition.

5 Claims, 2 Drawing Sheets

(51) Int. Cl.

| | |
|---|---|
| ***C23C 16/32*** | (2006.01) |
| ***C23C 16/34*** | (2006.01) |
| ***C23C 16/40*** | (2006.01) |

(56) References Cited

U.S. PATENT DOCUMENTS

| | | | | |
|---|---|---|---|---|
| 2017/0356083 | A1 | 12/2017 | Anthis | |
| 2019/0152996 | A1* | 5/2019 | Park | H01L 21/0228 |

FOREIGN PATENT DOCUMENTS

| | | | |
|---|---|---|---|
| JP | 2019-134154 | A | 8/2019 |
| JP | 2019-156842 | A | 9/2019 |
| KR | 10-2008-0113053 | A | 12/2008 |
| KR | 10-2010-0084182 | A | 7/2010 |
| KR | 10-2016-0085357 | A | 7/2016 |
| KR | 10-2017-0006205 | A | 1/2017 |
| KR | 10-2017-0020936 | A | 2/2017 |
| KR | 10-2017-0063092 | A | 6/2017 |
| KR | 10-2019-0082872 | A | 7/2019 |
| KR | 10-2020-0076357 | I | 6/2020 |
| TW | 201002855 | A | 1/2010 |
| WO | 2009149372 | A1 | 12/2009 |
| WO | 2010/132192 | A1 | 11/2010 |

* cited by examiner

YTTRIUM/LANTHANIDE METAL PRECURSOR COMPOUND, COMPOSITION FOR FORMING FILM INCLUDING THE SAME, AND METHOD OF FORMING YTTRIUM/LANTHANIDE METAL-CONTAINING FILM USING THE SAME

CROSS-REFERENCE TO RELATED APPLICATIONS

This application is a continuation of PCT Application No. PCT/KR2020/019058, filed on Dec. 24, 2020, which claims priority to Korean Patent Application Number 10-2019-0176737, filed on Dec. 27, 2019, both of which are hereby incorporated by reference in their entirety.

TECHNICAL FIELD

The present disclosure relates to an yttrium/lanthanide metal precursor compound, a precursor composition for depositing an yttrium/lanthanide metal-containing film including the yttrium/lanthanide metal precursor compound, and a method of depositing the yttrium/lanthanide metal-containing film using the precursor composition.

BACKGROUND

An yttrium-containing oxide film or lanthanide metal-containing oxide film has a wide bandgap (5.6 eV), a low leakage current, a high breakdown voltage, a good thermal stability, and the like. Due to its various characteristics, it is being studied as a gate dielectric material for field effect transistors in semiconductor devices. The yttrium-containing oxide film or lanthanide metal-containing oxide film is being studied as a gate insulating film for DRAMs among semiconductor memory devices and a high-k dielectric layer for capacitors and is also being studied as an insulator in a metal-insulator-metal (MIM) structure of a nonvolatile resistance switching memory device.

Most of yttrium or lanthanide metal precursor compounds known so far are solid or highly viscous liquids with a low vapor pressure. Thus, when an yttrium- or lanthanide metal-containing oxide film is formed by a chemical vapor deposition (CVD) or atomic layer deposition (ALD) method in a mass production process of semiconductor devices, it is not suitable as a precursor.

In order to form an yttrium- or lanthanide metal-containing film required for manufacturing next-generation semiconductor devices by the ALD method, a precursor compound having a lower viscosity or higher vapor pressure than a known yttrium precursor compound or lanthanide metal precursor compound is needed.

PRIOR ART DOCUMENT

Korean Patent Laid-open Publication No. 10-2012-0017069.

DISCLOSURE OF THE INVENTION

Problems to be Solved by the Invention

The present disclosure is conceived to provide a novel yttrium or lanthanide metal precursor compound, a precursor composition for depositing a film including the metal precursor compound, and a method of forming an yttrium- or lanthanide metal-containing film using the precursor composition.

Particularly, the present disclosure is conceived to provide a precursor compound having a lower viscosity than a known precursor compound, a precursor composition for depositing a film including the same, and a film forming method using the precursor composition.

However, problems to be solved by the present disclosure are not limited to the above-described problems. Although not described herein, other problems to be solved by the present disclosure can be clearly understood by a person with ordinary skill in the art from the following description.

Means for Solving the Problems

A first aspect of the present disclosure provides an yttrium or lanthanide metal-containing precursor compound, represented by the following Chemical Formula I:

$$(R^1Cp)_2M[(CH_3)_2CH—N—C(CH_2CH_3)═N—CH(CH_3)_2]; \quad \text{[Chemical Formula I]}$$

wherein, in the above Chemical Formula I,

M is selected from Y, La, Ce, Pr, Nd, Pm, Sm, Eu, Gd, Tb, Dy, Ho, Er, Tm, Yb and Lu, $R^1$ is an n-propyl group ($^n$Pr) or iso-propyl group ($^i$Pr), and the Cp is a cyclopentadienyl group.

A second aspect of the present disclosure provides a precursor composition for forming an yttrium or lanthanide metal-containing film, including yttrium or lanthanide metal-containing precursor compound according to the first aspect.

A third aspect of the present disclosure provides a method of forming an yttrium or lanthanide metal-containing film, including forming an yttrium or lanthanide metal-containing film using the precursor composition for forming an yttrium or lanthanide metal-containing film according to the second aspect.

Effects of the Invention

A novel yttrium compound- or lanthanide metal-containing precursor compound according to embodiments of the present disclosure is a novel compound that is not known in the prior art. The novel yttrium compound- or lanthanide metal-containing precursor compound according to embodiments of the present disclosure is thermally stable as a liquid at room temperature.

The novel yttrium- or lanthanide metal-containing precursor compound according to embodiments of the present disclosure has a lower viscosity than a conventionally known yttrium- or lanthanide metal-containing precursor compound, and is suitable for forming an yttrium- or lanthanide metal-containing film by an Atomic layer deposition (ALD) or Chemical vapor deposition (CVD) process because when a low-viscosity liquid (solvent) is added and mixed to lower the viscosity for use in an ALD or CVD precursor liquid transport apparatus, the novel yttrium- or lanthanide metal-containing precursor compound enables preparation of a mixture having a required viscosity with a small amount of the low-viscosity liquid (solvent).

The novel yttrium compound- or lanthanide metal-containing precursor compound according to embodiments of the present disclosure has a high thermal stability and thus can be used as a precursor of vapor deposition, for example, atomic layer deposition (ALD) or chemical vapor deposition (CVD), to form an yttrium- or lanthanide metal-containing film.

A composition including the yttrium- or lanthanide metal-containing precursor compound and a method of forming an yttrium- or lanthanide metal-containing film using the precursor composition according to embodiments of the present disclosure can be applied to the manufacture of commercial semiconductor devices. Particularly, in order to manufacture a DRAM semiconductor device, a high-k material needs to be formed to a thickness of from about 1 nm to about 10 μm on a substrate including a groove with a width of from about 10 nm to about 1 μm or less than about 100 nm or about 50 nm and an aspect ratio of from about 1 to about 50, about 10 or more, about 20 or more or about 30 or more. With the yttrium- or lanthanide metal-containing precursor compound and the precursor composition including the same according to the present disclosure, it is possible to form an yttrium- or lanthanide metal-containing film with a commercially required thickness on the above-described substrate. Also, with the yttrium- or lanthanide metal-containing precursor compound and the precursor composition including the same according to embodiments of the present disclosure, it is possible to form an yttrium- or lanthanide metal-containing film with a uniform thickness of several to several tens of nm on the entire surface of a substrate including a fine corrugation (groove) with an aspect ratio of about 1 or more and a width of about 1 μm or less as well as on the surface of the fine corrugation (groove) from the deepest surface of the fine unevenness (groove) to the top surface of the fine corrugation (groove).

Particularly, since it is necessary to form a high-k material film with a uniform thickness even at a temperature of about 280° C. or about 300° C. or more, a precursor composition that enables formation of a film with a uniform thickness on a substrate including a very narrow and deep groove by the atomic layer deposition (ALD) method even at a high temperature is needed. Accordingly, there is a need for an yttrium- or lanthanide metal-containing precursor compound with a very high thermal stability that satisfies the above requirements. Therefore, the yttrium- or lanthanide metal-containing precursor compound according to embodiments of the present disclosure can be usefully used as a precursor satisfying the required properties.

The yttrium- or lanthanide metal-containing precursor compound according to embodiments of the present disclosure has a constant growth per cycle (GPC) in a wide temperature range and thus is more suitable for depositing an yttrium- or lanthanide metal-containing film that needs to be finely controlled to have a uniform thickness in an ALD process than a conventional yttrium- or lanthanide metal-containing precursor compound whose GPC is not constant as temperature changes.

The yttrium- or lanthanide metal-containing precursor compound according to embodiments of the present disclosure has a constant GPC regardless of the precursor supply time and thus is more suitable for forming a film with a uniform thickness on a substrate on which even a corrugation (groove) structure with a high aspect ratio and a small width exists than a conventional yttrium precursor whose GPC is not constant depending on the precursor supply time.

The yttrium- or lanthanide metal-containing precursor compound according to embodiments of the present disclosure can be used as a precursor for ALD, CVD, etc. to provide the performance, for example, improved thermal stability, high volatility and/or increased deposition rate, required for the manufacture of next-generation devices such as semiconductors. Therefore, the yttrium- or lanthanide metal-containing precursor compound according to embodiments of the present disclosure can be usefully used to form an yttrium- or lanthanide metal-containing film or thin film.

The yttrium compound- or lanthanide metal-containing compound according to embodiments of the present disclosure can be applied to various fields such as catalysts.

BEST MODE FOR CARRYING OUT THE INVENTION

Figure 1:
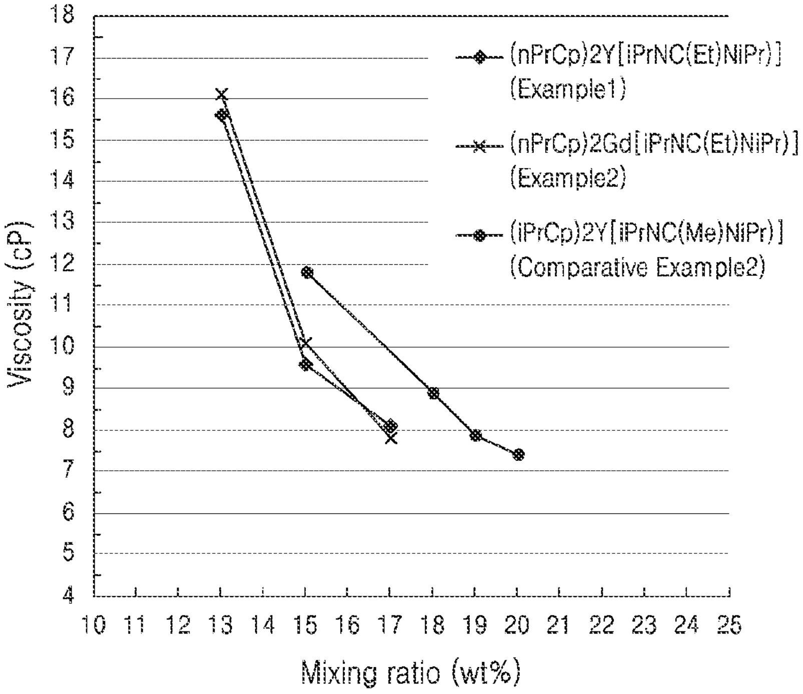
FIG. 1 is a graph showing the viscosity of precursor compounds according to Example 1, Example 2 and Comparative Example 2 of the present disclosure depending on the octane mixing ratio.

Hereinafter, embodiments and examples of the present disclosure will be described in detail with reference to the accompanying drawings so that the present disclosure may be readily implemented by those skilled in the art. However, it is to be noted that the present disclosure is not limited to the examples but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the other element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through this whole specification, a phrase in the form "A and/or B" means "A or B, or A and B".

Through the whole document, the term "alkyl" or "alkyl group" includes a linear or branched alkyl group having 1 to 12 carbon atoms, 1 to 10 carbon atoms, 1 to 8 carbon atoms, or 1 to 5 carbon atoms and all the possible isomers thereof. For example, the alkyl or alkyl group may include a methyl group (Me), an ethyl group (Et), a n-propyl group ($^{n}$Pr), an iso-propyl group ($^{i}$Pr), a n-butyl group ($^{n}$Bu), an iso-butyl group ($^{i}$Bu), a tert-butyl group ($^{t}$Bu), a sec-butyl group ($^{sec}$Bu), a n-pentyl group ($^{n}$Pe), an iso-pentyl group ($^{iso}$Pe), a sec-pentyl group ($^{sec}$Pe) a tert-pentyl group ($^{t}$Pe), a neopentyl group ($^{neo}$Pe) a 3-pentyl group, a n-hexyl group, an iso-hexyl group, a heptyl group, a 4,4-dimethyl pentyl group, an octyl group, a 2,2,4-trimethyl pentyl group, a nonyl group, a decyl group, an undecyl group, a dodecyl group, and isomers thereof, but may not be limited thereto.

Through the whole document, the term "yttrium or lanthanide metal element" may include Y, La, Ce, Pr, Nd, Pm, Sm, Eu, Gd, Tb, Dy, Ho, Er, Tm, Yb and Lu.

Through the whole document, the term "Cp" is expressed as $—C_5H_4$ and means an abbreviation of "cyclopentadienyl group".

Through the whole document, the term "film" means "a film or thin film".

Hereinafter, embodiments of the present disclosure have been described in detail, but the present disclosure may not be limited thereto.

A first aspect of the present disclosure provides an yttrium or lanthanide metal-containing precursor compound, represented by the following Chemical Formula I:

$(R^1Cp)_2M[(CH_3)_2CH—N—C(CH_2CH_3)=N—CH(CH_3)_2]$; [Chemical Formula I]

wherein, in the above Chemical Formula I,

M is selected from Y, La, Ce, Pr, Nd, Pm, Sm, Eu, Gd, Tb, Dy, Ho, Er, Tm, Yb and Lu, $R^1$ is an n-propyl group ($^{n}$Pr) or iso-propyl group ($^{i}$Pr), and the Cp is a cyclopentadienyl group.

In an embodiment of the present disclosure, the yttrium or lanthanide metal element-containing precursor compound may be selected from the following, but may not be limited thereto:

($^{n}$PrCp)$_2$Y($^{i}$Pr—N—C(Et)=N—$^{i}$Pr), ($^{n}$PrCp)$_2$La($^{i}$Pr—N—C(Et)=N—$^{i}$Pr), ($^{n}$PrCp)$_2$Ce($^{i}$Pr—N—C(Et)=N—$^{i}$Pr), ($^{n}$PrCp)$_2$Pr($^{i}$Pr—N—C(Et)=N—$^{i}$Pr), ($^{n}$PrCp)$_2$Nd($^{i}$Pr—N—C(Et)=N—$^{i}$Pr), ($^{n}$PrCp)$_2$Pm($^{i}$Pr—N—C(Et)=N—$^{i}$Pr), ($^{n}$PrCp)$_2$Sm($^{i}$Pr—N—C(Et)=N—$^{i}$Pr), ($^{n}$PrCp)$_2$Eu($^{i}$Pr—N—C(Et)=N—$^{i}$Pr), ($^{n}$PrCp)$_2$Gd($^{i}$Pr—N—C(Et)=N—$^{i}$Pr), ($^{n}$PrCp)$_2$Tb($^{i}$Pr—N—C(Et)=N—$^{i}$Pr), ($^{n}$PrCp)$_2$Dy($^{i}$Pr—N—C(Et)=N—$^{i}$Pr), ($^{n}$PrCp)$_2$Ho($^{i}$Pr—N—C(Et)=N—$^{i}$Pr), ($^{n}$PrCp)$_2$Er($^{i}$Pr—N—C(Et)=N—$^{i}$Pr), ($^{n}$PrCp)$_2$Tm($^{i}$Pr—N—C(Et)=N—$^{i}$Pr), ($^{n}$PrCp)$_2$Yb($^{i}$Pr—N—C(Et)=N—$^{i}$Pr), ($^{n}$PrCp)$_2$Lu($^{i}$Pr—N—C(Et)=N—$^{i}$Pr), ($^{i}$PrCp)$_2$Y($^{i}$Pr—N—C(Et)=N—$^{i}$Pr), ($^{i}$PrCp)$_2$La($^{i}$Pr—N—C(Et)=N—$^{i}$Pr), ($^{i}$PrCp)$_2$Ce($^{i}$Pr—N—C(Et)=N-$^{i}$Pr), ($^{i}$PrCp)$_2$Pr($^{i}$Pr—N—C(Et)=N—$^{i}$Pr), ($^{i}$PrCp)$_2$Nd($^{i}$Pr—N—C(Et)=N—$^{i}$Pr), ($^{i}$PrCp)$_2$Pm($^{i}$Pr—N—C(Et)=N—$^{i}$Pr), ($^{i}$PrCp)$_2$Sm($^{i}$Pr—N—C(Et)=N—$^{i}$Pr), ($^{i}$PrCp)$_2$Eu($^{i}$Pr—N—C(Et)=N—$^{i}$Pr), ($^{i}$PrCp)$_2$Gd($^{i}$Pr—N—C(Et)=N—$^{i}$Pr), ($^{i}$PrCp)$_2$Tb($^{i}$Pr—N—C(Et)=N—$^{i}$Pr), ($^{i}$PrCp)$_2$Dy($^{i}$Pr—N—C(Et)=N—$^{i}$Pr), ($^{i}$PrCp)$_2$Ho($^{i}$Pr—N—C(Et)=N—$^{i}$Pr), ($^{i}$PrCp)$_2$Er($^{i}$Pr—N—C(Et)=N-$^{i}$Pr), ($^{i}$PrCp)$_2$Tm($^{i}$Pr—N—C(Et)=N—$^{i}$Pr), ($^{i}$PrCp)$_2$Yb($^{i}$Pr—N—C(Et)=N—$^{i}$Pr), and ($^{i}$PrCp)$_2$Lu($^{i}$Pr—N—C(Et)=N—$^{i}$Pr).

In an embodiment of the present disclosure, the yttrium or lanthanide metal element-containing precursor compound may be ($^{n}$PrCp)$_2$Y($^{i}$Pr—N—C(Et)=N—$^{i}$Pr), ($^{n}$PrCp)$_2$Gd($^{i}$Pr—N—C(Et)=N—$^{i}$Pr), ($^{i}$PrCp)$_2$Y($^{i}$Pr—N—C(Et)=N—$^{i}$Pr), or ($^{i}$PrCp)$_2$Gd($^{i}$Pr—N—C(Et)=N—$^{i}$Pr).

A second aspect of the present disclosure provides a precursor composition for forming an yttrium or lanthanide metal-containing film, including at least one yttrium or lanthanide metal-containing precursor compound according to the first aspect.

Detailed descriptions of the second aspect of the present disclosure, which overlap with those of the first aspect of the present disclosure, are omitted hereinafter, but the descriptions of the first aspect of the present disclosure may be identically applied to the second aspect of the present disclosure, even though they are omitted hereinafter.

In an embodiment of the present disclosure, the precursor composition for forming an yttrium or lanthanide metal-containing film may include at least one yttrium or lanthanide metal-containing precursor compound selected from the following, but may not be limited thereto:

($^{n}$PrCp)$_2$Y($^{i}$Pr—N—C(Et)=N—$^{i}$Pr), ($^{n}$PrCp)$_2$La($^{i}$Pr—N—C(Et)=N—$^{i}$Pr), ($^{n}$PrCp)$_2$Ce($^{i}$Pr—N—C(Et)=N-$^{i}$Pr), ($^{n}$PrCp)$_2$Pr($^{i}$Pr—N—C(Et)=N—$^{i}$Pr), ($^{n}$PrCp)$_2$Nd($^{i}$Pr—N—C(Et)=N—$^{i}$Pr), ($^{n}$PrCp)$_2$Pm($^{i}$Pr—N—C(Et)=N—$^{i}$Pr), ($^{n}$PrCp)$_2$Sm($^{i}$Pr—N—C(Et)=N—$^{i}$Pr), ($^{n}$PrCp)$_2$Eu($^{i}$Pr—N—C(Et)=N—$^{i}$Pr), ($^{n}$PrCp)$_2$Gd($^{i}$Pr—N—C(Et)=N—$^{i}$Pr), ($^{n}$PrCp)$_2$Tb($^{i}$Pr—N—C(Et)=N—$^{i}$Pr), ($^{n}$PrCp)$_2$Dy($^{i}$Pr—N—C(Et)=N—$^{i}$Pr), ($^{n}$PrCp)$_2$Ho($^{i}$Pr—N—C(Et)=N—$^{i}$Pr), ($^{n}$PrCp)$_2$Er($^{i}$Pr—N—C(Et)=N—$^{i}$Pr), ($^{n}$PrCp)$_2$Tm($^{i}$Pr—N—C(Et)=N—$^{i}$Pr), ($^{n}$PrCp)$_2$Yb($^{i}$Pr—N—C(Et)=N—$^{i}$Pr), ($^{n}$PrCp)$_2$Lu($^{i}$Pr—N—C(Et)=N—$^{i}$Pr), ($^{i}$PrCp)$_2$Y($^{i}$Pr—N—C(Et)=N—$^{i}$Pr), ($^{i}$PrCp)$_2$La($^{i}$Pr—N—C(Et)=N—$^{i}$Pr), ($^{i}$PrCp)$_2$Ce($^{i}$Pr—N—C(Et)=N-$^{i}$Pr), ($^{i}$PrCp)$_2$Pr($^{i}$Pr—N—C(Et)=N—$^{i}$Pr), ($^{i}$PrCp)$_2$Nd($^{i}$Pr—N—C(Et)=N—$^{i}$Pr), ($^{i}$PrCp)$_2$Pm($^{i}$Pr—N—C(Et)=N—$^{i}$Pr), ($^{i}$PrCp)$_2$Sm($^{i}$Pr—N—C(Et)=N—$^{i}$Pr), ($^{i}$PrCp)$_2$Eu($^{i}$Pr—N—C(Et)=N—$^{i}$Pr), ($^{i}$PrCp)$_2$Gd($^{i}$Pr—N—C(Et)=N—$^{i}$Pr), ($^{i}$PrCp)$_2$Tb($^{i}$Pr—N—C(Et)=N—$^{i}$Pr), ($^{i}$PrCp)$_2$Dy($^{i}$Pr—N—C(Et)=N—$^{i}$Pr), ($^{i}$PrCp)$_2$Ho($^{i}$Pr—N—C(Et)=N—$^{i}$Pr), ($^{i}$PrCp)$_2$Er($^{i}$Pr—N—C(Et)=N—$^{i}$Pr), ($^{i}$PrCp)$_2$Tm($^{i}$Pr—N—C(Et)=N—$^{i}$Pr), ($^{i}$PrCp)$_2$Yb($^{i}$Pr—N—C(Et)=N—$^{i}$Pr), and ($^{i}$PrCp)$_2$Lu($^{i}$Pr—N—C(Et)=N—$^{i}$Pr).

In an embodiment of the present disclosure, the yttrium or lanthanide metal element-containing precursor compound may be ($^{n}$PrCp)$_2$Y($^{i}$Pr—N—C(Et)=N—$^{i}$Pr), ($^{n}$PrCp)$_2$Gd($^{i}$Pr—N—C(Et)=N—$^{i}$Pr), ($^{i}$PrCp)$_2$Y($^{i}$Pr—N—C(Et)=N—$^{i}$Pr), or ($^{i}$PrCp)$_2$Gd($^{i}$Pr—N—C(Et)=N—$^{i}$Pr).

In an embodiment of the present disclosure, the yttrium or lanthanide metal-containing film may be an yttrium or lanthanide metal film, an yttrium or lanthanide metal-containing oxide film, an yttrium or lanthanide metal-containing nitride film, or an yttrium or lanthanide metal-containing carbide film, but may not be limited thereto. In an embodiment of the present disclosure, the yttrium or lanthanide metal-containing film may be an yttrium or lanthanide metal-containing oxide film.

In an embodiment of the present disclosure, the precursor composition for forming an yttrium or lanthanide metal-containing film may further include at least one nitrogen source selected from ammonia, nitrogen, hydrazine and dimethyl hydrazine, but may not be limited thereto.

In an embodiment of the present disclosure, the precursor composition for forming an yttrium or lanthanide metal-containing film may further include at least one oxygen source selected from water vapor, oxygen and ozone, but may not be limited thereto.

A third aspect of the present disclosure provides a method of forming an yttrium or lanthanide metal-containing film, including forming an yttrium or lanthanide metal-containing film using the precursor composition for forming an yttrium or lanthanide metal-containing film according to the second aspect.

Detailed descriptions of the third aspect of the present disclosure, which overlap with those of the first aspect and the second aspect of the present disclosure, are omitted hereinafter, but the descriptions of the first aspect and the second aspect of the present disclosure may be identically applied to the third aspect of the present disclosure, even though they are omitted hereinafter.

In an embodiment of the present disclosure, the yttrium or lanthanide metal-containing film may be an yttrium or lanthanide metal film, an yttrium or lanthanide metal-containing oxide film, an yttrium or lanthanide metal-containing nitride film, or an yttrium or lanthanide metal-containing carbide film, but may not be limited thereto. In an embodiment of the present disclosure, the yttrium or lanthanide metal-containing film may be an yttrium or lanthanide metal-containing oxide film.

In an embodiment of the present disclosure, the yttrium or lanthanide metal-containing film may be deposited by chemical vapor deposition (CVD) or atomic layer deposition (ALD), but may not be limited thereto. In an embodiment of the present disclosure, the yttrium or lanthanide metal-containing film may be deposited by metal organic chemical vapor deposition (MOCVD) or atomic layer deposition (ALD), but may not be limited thereto. In an embodiment of the present disclosure, the yttrium or lanthanide metal-containing film may be deposited by atomic layer deposition (ALD).

Also, the chemical vapor deposition method or the atomic layer deposition method can be performed using a deposition apparatus, deposition conditions, and/or additional reactant gases known in the art, but may not be limited thereto. Herein, if an yttrium- or lanthanide metal-containing oxide film is deposited by the atomic layer deposition method, the process temperature can be controlled during deposition and the thickness and composition of a thin film can be precisely controlled. Therefore, it is possible to deposit a thin film having excellent coatability even on a substrate having a complicated shape and also possible to improve the thickness uniformity and physical properties of the thin film.

In an embodiment of the present disclosure, a thickness of the yttrium- or lanthanide metal-containing film may be about 1 nm to about 10 μm and can be variously applied depending on the purpose of application, but may not be limited thereto. In an embodiment of the present disclosure, a thickness of an yttrium metal-containing oxide film may be about 1 nm to about 10 μm and can be variously applied depending on the purpose of application, but may not be limited thereto. For example, the thickness of the yttrium- or lanthanide metal-containing film may be about 1 nm to about 10 μm, about 1 nm to about 5 μm, about 1 nm to about 1 μm, about 1 nm to about 900 nm, about 1 nm to about 800 nm, about 1 nm to about 700 nm, about 1 nm to about 600 nm, about 1 nm to about 500 nm, about 1 nm to about 400 nm, about 1 nm to about 300 nm, about 1 nm to about 200 nm, about 1 nm to about 100 nm, about 1 nm to about 50 nm, about 1 nm to about 30 nm, about 1 nm to about 20 nm, about 1 nm to about 10 nm, about 10 nm to about 10 μm, about 10 nm to about 5 μm, about 10 nm to about 1 μm, about 10 nm to about 900 nm, about 10 nm to about 800 nm, about 10 nm to about 700 nm, about 10 nm to about 600 nm, about 10 nm to about 500 nm, about 10 nm to about 400 nm, about 10 nm to about 300 nm, about 10 nm to about 200 nm, about 10 nm to about 100 nm, about 10 nm to about 50 nm, about 10 nm to about 30 nm, about 10 nm to about 20 nm, about 20 nm to about 10 μm, about 20 nm to about 5 μm, about 20 nm to about 1 μm, about 20 nm to about 900 nm, about 20 nm to about 800 nm, about 20 nm to about 700 nm, about 20 nm to about 600 nm, about 20 nm to about 500 nm, about 20 nm to about 400 nm, about 20 nm to about 300 nm, about 20 nm to about 200 nm, about 20 nm to about 100 nm, about 20 nm to about 50 nm, about 20 nm to about 30 nm, about 30 nm to about 10 μm, about 30 nm to about 5 μm, about 30 nm to about 1 μm, about 30 nm to about 900 nm, about 30 nm to about 800 nm, about 30 nm to about 700 nm, about 30 nm to about 600 nm, about 30 nm to about 500 nm, about 30 nm to about 400 nm, about 30 nm to about 300 nm, about 30 nm to about 200 nm, about 30 nm to about 100 nm, about 30 nm to about 50 nm, about 50 nm to about 10 μm, about 50 nm to about 5 μm, about 50 nm to about 1 μm, about 50 nm to about 900 nm, about 50 nm to about 800 nm, about 50 nm to about 700 nm, about 50 nm to about 600 nm, about 50 nm to about 500 nm, about 50 nm to about 400 nm, about 50 nm to about 300 nm, about 50 nm to about 200 nm, about 50 nm to about 100 nm, about 100 nm to about 10 μm, about 100 nm to about 5 μm, about 100 nm to about 1 μm, about 100 nm to about 900 nm, about 100 nm to about 800 nm, about 100 nm to about 700 nm, about 100 nm to about 600 nm, about 100 nm to about 500 nm, about 100 nm to about 400 nm, about 100 nm to about 300 nm, about 100 nm to about 200 nm, about 200 nm to about 10 μm, about 200 nm to about 5 μm, about 200 nm to about 1 μm, about 200 nm to about 900 nm, about 200 nm to about 800 nm, about 200 nm to about 700 nm, about 200 nm to about 600 nm, about 200 nm to about 500 nm, about 200 nm to about 400 nm, about 200 nm to about 300 nm, about 300 nm to about 10 μm, about 300 nm to about 5 μm, about 300 nm to about 1 μm, about 300 nm to about 900 nm, about 300 nm to about 800 nm, about 300 nm to about 700 nm, about 300 nm to about 600 nm, about 300 nm to about 500 nm, about 300 nm to about 400 nm, about 400 nm to about 10 μm, about 400 nm to about 5 μm, about 400 nm to about 1 μm, about 400 nm to about 900 nm, about 400 nm to about 800 nm, about 400 nm to about 700 nm, about 400 nm to about 600 nm, about 400 nm to about 500 nm, about 500 nm to about 10 μm, about 500 nm to about 5 μm, about 500 nm to about 1 μm, about 500 nm to about 900 nm, about 500 nm to about 800 nm, about 500 nm to about 700 nm, about 500 nm to about 600 nm, about 600 nm to about 10 μm, about 600 nm to about 5 μm, about 600 nm to about 1 μm, about 600 nm to about 900 nm, about 600 nm to about 800 nm, about 600 nm to about 700 nm, about 700 nm to about 10 μm, about 700 nm to about 5 μm, about 700 nm to about 1 μm, about 700 nm to about 900 nm, about 700 nm to about 800 nm, about 800 nm to about 10 μm, about 800 nm to about 5 μm, about 800 nm to about 1 μm, about 800 nm to about 900 nm, about 900 nm to about 10 μm, about 900 nm to about 5 μm, about 900 nm to about 1 μm, about 1 μm to about 10 μm, about 1 μm to about 5 μm, or about 5 μm to about 10 μm, but may not be limited thereto.

In an embodiment of the present disclosure, the yttrium or lanthanide metal-containing film may be formed in a temperature range of about 100° C. to about 500° C., but may not be limited thereto. For example, the yttrium or lanthanide metal-containing film may be formed in a temperature range of about 100° C. to about 500° C., about 100° C. to about 450° C., about 100° C. to about 400° C., about 100° C. to about 350° C., about 100° C. to about 300° C., about 100° C. to about 250° C., about 100° C. to about 200° C., about 100° C. to about 150° C., about 150° C. to about 500° C., about 150° C. to about 450° C., about 150° C. to about 400° C., about 150° C. to about 350° C., about 150° C. to about 300° C., about 150° C. to about 250° C., about 150° C. to about 200° C., about 200° C. to about 500° C., about 200° C. to about 450° C., about 200° C. to about 400° C., about 200° C. to about 350° C., about 200° C. to about 300° C., about 200° C. to about 250° C., about 250° C. to about 500° C., about 250° C. to about 450° C., about 250° C. to about 400° C., about 250° C. to about 350° C., about 250° C. to about 300° C., about 300° C. to about 500° C., about 300° C. to about 450° C., about 300° C. to about 400° C., about 300° C. to about 350° C., about 350° C. to about 500° C., about 350° C. to about 450° C., about 350° C. to about 400° C., about 400° C. to about 500° C., about 400° C. to about 450° C., or about 450° C. to about 500° C., but may not be limited thereto.

In an embodiment of the present disclosure, the yttrium or lanthanide metal-containing film may be formed on a substrate including trenches with an aspect ratio of about 1 to about 100 and a width of about 10 nm to about 1 μm, but may not be limited thereto. For example, the aspect ratio may be about 1 to about 100, about 1 to about 80, about 1 to about 60, about 1 to about 50, about 1 to about 40, about 1 to about 30, about 1 to about 20, about 1 to about 10, about 10 to about 100, about 10 to about 80, about 10 to about 60, about 10 to about 50, about 10 to about 40, about 10 to about 30, about 10 to about 20, about 20 to about 100, about 20 to about 80, about 20 to about 60, about 20 to about 50, about 20 to about 40, about 20 to about 30, about 30 to about 100, about 30 to about 80, about 30 to about 60, about 30 to about 50, about 30 to about 40, about 40 to about 100, about 40 to about 80, about 40 to about 60, about 40 to about 50, about 50 to about 80, about 50 to about 60, about 60 to about 100, about 60 to about 80, or about 80 to about 100, but may not be limited thereto. Also, for example, the width may be about 10 nm to about 1 μm, about 10 nm to about 900 nm, about 10 nm to about 800 nm, about 10 nm to about 700 nm, about 10 nm to about 600 nm, about 10 nm to about 500 nm, about 10 nm to about 400 nm, about 10 nm to about 300 nm, about 10 nm to about 200 nm, about 10 nm to about 100 nm, about 10 nm to about 90 nm, about 10 nm to about 80 nm, about 10 nm to about 70 nm, about 10 nm to about 60 nm, about 10 to about 50 nm, about 10 nm to about 40 nm, about 10 nm to about 30 nm, about 10 nm to about 20 nm, about 20 nm to about 1 μm, about 20 nm to about 900 nm, about 20 nm to about 800 nm, about 20 nm to about 700 nm, about 20 nm to about 600 nm, about 20 nm to about 500 nm, about 20 nm to about 400 nm, about 20 nm to about 300 nm, about 20 nm to about 200 nm, about 20 nm to about 100 nm, about 20 nm to about 90 nm, about 20 nm to about 80 nm, about 20 nm to about 70 nm, about 20 nm to about 60 nm, about 20 to about 50 nm, about 20 nm to about 40 nm, about 20 nm to about 30 nm, about 30 nm to about 1 μm, about 30 nm to about 900 nm, about 30 nm to about 800 nm, about 30 nm to about 700 nm, about 30 nm to about 600 nm, about 30 nm to about 500 nm, about 30 nm to about 400 nm, about 30 nm to about 300 nm, about 30 nm to about 200 nm, about 30 nm to about 100 nm, about 30 nm to about 90 nm, about 30 nm to about 80 nm, about 30 nm to about 70 nm, about 30 nm to about 60 nm, about 30 to about 50 nm, about 30 nm to about 40 nm, about 40 nm to about 1 μm, about 40 nm to about 900 nm, about 40 nm to about 800 nm, about 40 nm to about 700 nm, about 40 nm to about 600 nm, about 40 nm to about 500 nm, about 40 nm to about 400 nm, about 40 nm to about 300 nm, about 40 nm to about 200 nm, about 40 nm to about 100 nm, about 40 nm to about 90 nm, about 40 nm to about 80 nm, about 40 nm to about 70 nm, about 40 nm to about 60 nm, about 40 to about 50 nm, about 50 nm to about 1 μm, about 50 nm to about 900 nm, about 50 nm to about 800 nm, about 50 nm to about 700 nm, about 50 nm to about 600 nm, about 50 nm to about 500 nm, about 50 nm to about 400 nm, about 50 nm to about 300 nm, about 50 nm to about 200 nm, about 50 nm to about 100 nm, about 50 nm to about 90 nm, about 50 nm to about 80 nm, about 50 nm to about 70 nm, about 50 nm to about 60 nm, about 100 nm to about 1 μm, about 100 nm to about 900 nm, about 100 nm to about 800 nm, about 100 nm to about 700 nm, about 100 nm to about 600 nm, about 100 nm to about 500 nm, about 100 nm to about 400 nm, about 100 nm to about 300 nm, about 100 nm to about 200 nm, about 200 nm to about 1 μm, about 200 nm to about 900 nm, about 200 nm to about 800 nm, about 200 nm to about 700 nm, about 200 nm to about 600 nm, about 200 nm to about 500 nm, about 200 nm to about 400 nm, about 200 nm to about 300 nm, about 300 nm to about 1 μm, about 300 nm to about 900 nm, about 300 nm to about 800 nm, about 300 nm to about 700 nm, about 300 nm to about 600 nm, about 300 nm to about 500 nm, about 300 nm to about 400 nm, about 400 nm to about 1 μm, about 400 nm to about 900 nm, about 400 nm to about 800 nm, about 400 nm to about 700 nm, about 400 nm to about 600 nm, about 400 nm to about 500 nm, about 500 nm to about 1 μm, about 500 nm to about 900 nm, about 500 nm to about 800 nm, about 500 nm to about 700 nm, about 500 nm to about 600 nm, about 600 nm to about 1 μm, about 600 nm to about 900 nm, about 600 nm to about 800 nm, about 600 nm to about 700 nm, about 700 nm to about 1 μm, about 700 nm to about 900 nm, about 700 nm to about 800 nm, about 800 nm to about 1 μm, about 800 nm to about 900 nm, or about 900 nm to about 1 μm, but may not be limited thereto.

A deposition method using a composition including an yttrium or lanthanide metal precursor compound according to an embodiment of the present disclosure includes formation of an yttrium- or lanthanide metal-containing oxide film by supplying a precursor composition containing an yttrium or lanthanide metal compound in a gaseous state to a substrate located inside a deposition chamber, but may not be limited thereto. The film deposition method may be performed using a method, an apparatus, etc. known in the art, or may be performed using one or more additional reactant gases together if necessary. As the substrate, a silicon semiconductor wafer, a compound semiconductor wafer, and a plastic substrate (PI, PET or PES) may be used, but the present disclosure may not be limited thereto. A substrate including a hole or groove may be used, or a porous substrate having a large surface area may be used.

The yttrium or lanthanide metal precursor compound according to an embodiment of the present disclosure may include deposition of an yttrium- or lanthanide metal-containing oxide film by metal organic chemical vapor deposition (MOCVD) or atomic layer deposition (ALD), but may not be limited thereto. The MOCVD or ALD may be performed using a deposition apparatus, deposition conditions, and additional reactant gases known in the art.

In the precursor composition for depositing an yttrium or lanthanide metal-containing oxide film and the deposition method including formation of an yttrium or lanthanide metal-containing oxide film using the precursor composition for film deposition according to an embodiment of the present disclosure, the yttrium or lanthanide metal precursor compound of the present disclosure contained in the precursor composition for film deposition has a low viscosity and a high thermal stability and thus can be used as a precursor for ALD or CVD to form an yttrium or lanthanide metal-containing oxide film. Particularly, an yttrium or lanthanide metal-containing oxide film with a thickness of from several μm to several tens of nm can be uniformly formed even on a substrate including a pattern (groove) on the surface, a porous substrate or a plastic substrate in a temperature range of from about 100° C. to about 500° C. or from about 250° C. to about 350° C., and an yttrium- or lanthanide metal-containing oxide film with a thickness of from several μm to several nm or less can be uniformly formed on the surface of a substrate with a fine trench (groove) with an aspect ratio of from about 1 to about 50 or from about 1 to about 100 or more and a width of about 1 μm to about 10 nm or less. An yttrium- or lanthanide metal-containing oxide film with a thickness of from several μm to several nm or less can be uniformly formed on the entire surface of a substrate including from the deepest surface of the fine unevenness (groove) to the top surface of the fine corrugation (groove).

In the thin film deposition method using an yttrium or lanthanide metal precursor compound according to an embodiment of the present disclosure, desirably, a substrate may be accommodated in a reaction chamber and then, the yttrium- or lanthanide metal-containing precursor compound may be transported onto the substrate by using a carrier gas or a dilution gas to deposit an yttrium- or lanthanide metal-containing oxide film in a wide deposition temperature range of from about 100° C. to about 500° C., from about 150° C. to about 450° C., from about 200° C. to about 400° C. or from about 250° C. to about 350° C.

Being capable of forming the yttrium or lanthanide metal-containing film according to an embodiment of the present disclosure at a deposition temperature of from about 250° C. to about 350° C. has great potential for application in various fields by widely expanding a range of process temperatures applicable to memory devices and non-memory devices such as logic devices. Further, since the yttrium- or lanthanide metal-containing oxide film has different film properties depending on the temperature, there is a need for a yttrium or lanthanide metal precursor compound usable in a wide temperature range. Therefore, it is desirable that deposition should be performed in a deposition temperature range of from about 250° C. to about 350° C.

In an embodiment of the present disclosure, it is desirable to use one or more mixed gases selected from argon (Ar), nitrogen ($N_2$), helium (He) or hydrogen ($H_2$) as the carrier gas or dilution gas.

In an embodiment of the present disclosure, the yttrium or lanthanide metal precursor compound may be transported onto the substrate by various supply methods including a bubbling method of forcibly vaporizing the precursor using a carrier gas and a bypass method of supplying the precursor in a gaseous state by heating a container and increasing a vapor pressure of the precursor. When the vapor pressure is low, a bypass method of heating a container and vaporizing the precursor may be employed. A method by which the yttrium or lanthanide metal precursor compound is placed in a bubbler container or VFC container and gasified by bubbling or heating the container using a carrier gas at a vapor pressure of from about 0.1 torr to about 10 torr in a temperature range of from room temperature to about 150° C. and then transported and supplied into a chamber may be used. Most preferably, a bypass method by which the yttrium or lanthanide metal precursor compound is supplied in a gaseous state by heating a container may be used.

In an embodiment of the present disclosure, the yttrium or lanthanide metal precursor compound may be transported using an argon (Ar) or nitrogen ($N_2$) gas or using heat energy or plasma, or more desirably, applying a bias onto the substrate.

In an embodiment of the present disclosure, the thin film may be a composite oxide film including a metal other than yttrium or a lanthanide metal. For example, the thin film may be a composite oxide film having the following composition including hafnium or zirconium, but may not be limited thereto:

Hf—Y—O, Zr—Y—O, Hf—Al—Y—O, Zr—Hf—Al—Y—O, Zr—Hf—Y—Si—O, Zr—Hf—Al—Y—Si—O, Hf—La—O, Zr—La—O, Hf—Al—La—O, Zr—Hf—Al—La—O, Zr—Hf—La—Si—O, Zr—Hf—Al—La—Si—O, Hf—Gd—O, Zr—Gd—O, Hf—Al—Gd—O, Zr—Hf—Al—Gd—O, Zr—Hf—Gd—Si—O, or Zr—Hf—Al—Gd—Si—O.

In an embodiment of the present disclosure, desirably, one or a mixture of two or more selected from water vapor ($H_2O$), oxygen ($O_2$), oxygen plasma ($O_2$ plasma), nitrogen oxides (NO, $N_2O$), nitrogen oxide plasma ($N_2O$ plasma), hydrogen peroxide ($H_2O_2$), and ozone ($O_3$) may be used as a reactant gas to deposit the yttrium- or lanthanide metal-containing oxide film or composite oxide film.

MODE FOR CARRYING OUT THE INVENTION

Hereinafter, the present disclosure will be explained in more detail with reference to Examples. However, the following Examples are illustrative only for better understanding of the present disclosure but do not limit the present disclosure.

EXAMPLES

<Preparation Example 1> Preparation of N,N'-isopropylpropionimidamide $(CH_3)_2CHNC(CH_2CH_3)NHCH(CH_3)_2$ After 152 g (0.862 mol) of triethyl ortho-propionate and 102 g (1.725 mol) of isopropylamine were put into a 500-mL Schlenk flask, 51.8 g (0.862 mol) of acetic acid was slowly drop-wise added to the flask and was refluxed at 170° C. or more for 20 hours.

After the reaction was completed, the solvent was removed under reduced pressure and extraction was carried out with 1.1 eq of an aqueous solution of diethylether and sodium hydroxide (NaOH). Then, the solvent was removed under reduced pressure and distillation was carried out under reduced pressure to obtain 97.6 g (72%) of a colorless transparent liquid compound.

<Example 1> Preparation of bis-n-propylcyclopentadienyl-N,N'-isopropyl-ethylamidinate yttrium $[Cp(CH_2)_2CH_3]_2Y[(CH_3)_2CHNC(CH_2CH_3)NCH(CH_3)_2]$ After sodium amide was put into a flame-dried 500-mL Schlenk flask, the flask was maintained at room temperature. After 250 mL of THF and n-propylcyclopentadiene were slowly drop-wise added to the flask, the obtained reaction solution was stirred at room temperature for 20 hours to prepare n-propylcyclopentadienyl sodium.

After 30 g (0.154 mol) of yttrium(III) chloride and 200 mL of n-hexane ($C_6H_{14}$) were put into a flame-dried 1-L Schlenk flask, the flask was maintained at room temperature. After the synthesized n-propylcyclopentadienyl sodium was slowly drop-wise added to the flask, the obtained reaction solution was stirred at room temperature for 20 hours to blend and react yttrium(III) chloride with n-propylcyclopentadienyl sodium and thus prepare a tris(n-propylcyclopentadienyl)yttrium (III) solution.

After 34.2 g (0.123 mol) of n-butyl lithium (n-BuLi, 23%) and 200 mL of n-hexane ($C_6H_{14}$) were put into a 500-mL flask, 19.2 g (0.123 mol) of N,N'-isopropylpropionimidamide $[(CH_3)_2CHNC(CH_2CH_3)NHCH(CH_3)_2]$ prepared in Preparation Example 1 was slowly drop-wise added to the flask. Then, the obtained reaction solution was stirred at room temperature for 3 hours to synthesize lithium amidinate.

The prepared lithium amidinate was slowly drop-wise added to the prepared tris(n-propylcyclopentadienyl)yttrium (III) and the mixed solution was refluxed for 20 hours.

After the reaction was completed, the solvent was removed under reduced pressure and distillation was carried out under reduced pressure to obtain 47 g (67%) of a yellow liquid compound represented by the following Chemical Formula 1.

[Chemical Formula 1]

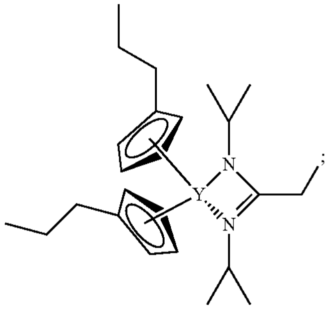

;

$^1$H-NMR (400 MHz, $C_6D_6$, 25° C.): δ 6.128, 6.057 (m, 8$^1$H-NMR (400 MHz, $C_6D_6$, 25° C.): δ 6.128, 6.057 (m, 8H, $C_6H_4$—$(CH_2)_2CH_3$), δ 3.351 (m, 2H, $(CH_3)_2CHNC(CH_2CH_3)NCH(CH_3)_2$), δ 2.532 (t, 4H, $C_6H_4$—$CH_2CH_2CH_3$), δ 1.979 (q, 2H, $(CH_3)_2CHNC(CH_2CH_3)NCH(CH_3)_2$), δ 1.653 (m, 4H, $C_6H_4$—$CH_2CH_2CH_3$), δ 1.001 (d, 12H, $(CH_3)_2CHNC(CH_2CH_3)NCH(CH_3)_2$), δ 0.969 (t, 6H, $C_6H_4$—$CH_2CH_2CH_3$), δ 0.915 (t, 3H, $(CH_3)_2CHNC(CH_2CH_3)NCH(CH_3)_2$)

<Example 2> Preparation of bis-n-propyl cyclopentadienyl-N,N'-isopropyl-ethylamidinate gadolinium $[Cp(CH_2)_2CH_3]Gd[(CH_3)_2CHNC(CH_2CH_3)NCH(CH_3)_2]$ After sodium amide was put into a flame-dried 500-mL Schlenk flask, the flask was maintained at room temperature. After 250 mL of THF and n-propylcyclopentadiene were slowly drop-wise added to the flask, the obtained reaction solution was stirred at room temperature for 20 hours to prepare n-propylcyclopentadienyl sodium.

After 50 g (0.190 mol) of gadolinium(III) chloride and 200 mL of n-hexane ($C_6H_{14}$) were put into a flame-dried 1-L Schlenk flask, the flask was maintained at room temperature. After the synthesized n-propylcyclopentadienyl sodium was slowly drop-wise added to the flask, the obtained reaction solution was stirred at room temperature for 20 hours to prepare a tris(n-propylcyclopentadienyl)gadolinium(III) solution.

After 42.3 g (0.152 mol) of n-butyl lithium (n-BuLi, 23%) and 200 mL of n-hexane ($C_6H_{14}$) were put into a 500 mL flask, 23.7 g (0.152 mol) of N,N'-isopropylpropionimidamide $[(CH_3)_2CHNC(CH_2CH_3)NHCH(CH_3)_2]$ prepared in Preparation Example 1 was slowly drop-wise added to the flask. Then, the obtained reaction solution was stirred at room temperature for 3 hours to prepare lithium amidinate.

The synthesized lithium amidinate was slowly drop-wise added to the synthesized tris(n-propylcyclopentadienyl) gadolinium(III) and the mixed solution was refluxed for 20 hours.

After the reaction was completed, the solvent was removed under reduced pressure and distillation was carried out under reduced pressure to obtain 58.7 g (59.5%) of a yellow liquid compound represented by the following Chemical Formula 2.

[Chemical Formula 2]

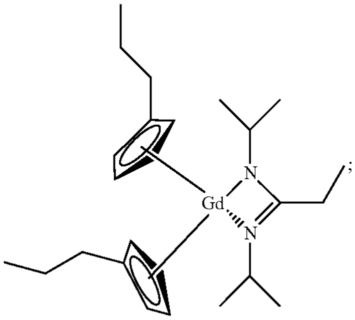

;

<Comparative Example 1> Preparation of bis-ethyl-cyclopentadienyl-N,N'-isopropyl-ethylamidinate yttrium $(EtCp)_2Y[^iPrNC(Et)N^iPr]$ After sodium amide was put into a flame-dried 500-mL Schlenk flask, the flask was maintained at room temperature. After 250 mL of THF and 63.7 g (0.676 mol) of ethylcyclopentadiene were slowly drop-wise added to the flask, the obtained reaction solution was stirred at room temperature for 20 hours to prepare ethyl-cyclopentadienyl sodium.

After 40 g (0.205 mol) of yttrium(III) chloride and 200 mL of n-hexane ($C_6H_{14}$) were put into a flame-dried 1-L Schlenk flask, the flask was maintained at room temperature. After the synthesized ethylcyclopentadienyl sodium was slowly drop-wise added to the flask, the obtained reaction solution was stirred at room temperature for 20 hours to prepare a tris(ethylcyclopentadienyl)yttrium(III) solution.

After 45.6 g (0.164 mol) of n-butyl lithium (n-BuLi, 23%) and 200 mL of n-hexane ($C_6H_{14}$) were put into another 500-mL flask, 25.6 g (0.164 mol) of N,N'-isopropylpropionimidamide $[(CH_3)_2CHNC(CH_2CH_3)NHCH(CH_3)_2]$ prepared in Preparation Example 1 was slowly drop-wise added to the flask. Then, the obtained reaction solution was stirred at room temperature for 3 hours to prepare lithium amidinate. The lithium amidinate solution was slowly drop-wise added to the tris(ethylcyclopentadienyl)yttrium(III) solution prepared in the 1-L Schlenk flask, and the mixed solution was refluxed at for 20 hours.

After the reaction was completed, the solvent was removed under reduced pressure and distillation was carried out under reduced pressure to obtain 52 g (59%) of a yellow solid compound represented by the following Chemical Formula 3.

[Chemical Formula 3]

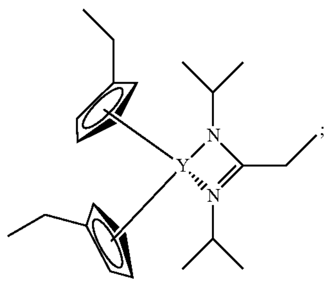

Melting point (mp) 36° C. (760 torr);

$^1$H-NMR (400 MHz, $C_6D_6$, 25° C.): δ 6.107, 6.057 (m, 8H, $C_6H_4$—$CH_2CH_3$), δ 3.337 (m, 2H, $(CH_3)_2CHNC(CH_2CH_3)NCH(CH_3)_2$), δ 2.552 (q, 4H, $C_6H_4$—$CH_2CH_3$), δ 1.969 (q, 2H, $(CH_3)_2CHNC(CH_2CH_3)NCH(CH_3)_2$), δ 1.237 (t, 6H, $C_6H_4$—$CH_2CH_3$), δ 0.988 (d, 12H, $(CH_3)_2CHNC(CH_2CH_3)NCH(CH_3)_2$), δ 0.896 (t, 3H, $(CH_3)_2CHNC(CH_2CH_3)NCH(CH_3)_2$)

Since the yttrium precursor compound of Comparative Example 1 is a solid at room temperature, it is not suitable for use in mass production of semiconductors compared to the yttrium precursor compound of Example 1.

<Example 3> Preparation of bis-isopropyl cyclopentadienyl-N,N'-isopropylethylamidinate yttrium ($^i$PrCp)$_2$Y[PrNC(Et)N$^i$Pr]

After sodium amide was put into a flame-dried 500-mL Schlenk flask, the flask was maintained at room temperature. After 250 mL of THF and isopropylcyclopentadiene were slowly drop-wise added to the flask, the obtained reaction solution was stirred at room temperature for 20 hours to prepare isopropylcyclopentadienyl sodium.

After 30 g (0.154 mol) of yttrium(III) chloride and 200 mL of n-hexane ($C_6H_{14}$) were put into a flame-dried 1 L Schlenk flask, the flask was maintained at room temperature. After the synthesized isopropylcyclopentadienyl sodium was slowly drop-wise added to the flask, the obtained reaction solution was stirred at room temperature for 20 hours to blend and react yttrium(III) chloride with isopropylcyclopentadienyl sodium and thus prepare a tris(isopropylcyclopentadienyl)yttrium (III) solution.

After 34.2 g (0.123 mol) of n-butyl lithium (n-BuLi, 23%) and 200 mL of n-hexane ($C_6H_{14}$) were put into a 500-mL flask, 19.2 g (0.123 mol) of N,N'-isopropylpropionimidamide [$(CH_3)_2CHNC(CH_2CH_3)NHCH(CH_3)_2$] prepared in Preparation Example 1 was slowly drop-wise added to the flask. Then, the obtained reaction solution was stirred at room temperature for 3 hours to synthesize lithium amidinate.

The synthesized lithium amidinate was slowly drop-wise added to the synthesized tris(isopropylcyclopentadienyl)yttrium (III) and the mixed solution was refluxed for 20 hours.

After the reaction was completed, the solvent was removed under reduced pressure and distillation was carried out under reduced pressure to obtain 47.7 g (68%) of a yellow liquid compound represented by the following Chemical Formula 4.

[Chemical Formula 4]

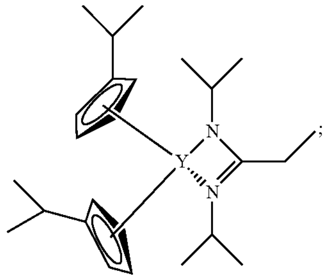

$^1$H-NMR (400 MHz, $C_6D_6$, 25° C.): δ 6.158, 6.098 (m, 8H, $C_6H_4$—$CH(CH_3)_2$), δ 3.359 (m, 2H, $(CH_3)_2CHNC(CH_2CH_3)NCH(CH_3)_2$), δ 2.960 (m, 2H, $C_6H_4$—$CH(CH_3)_2$), δ 1.984 (q, 2H, $(CH_3)_2CHNC(CH_2CH_3)NCH(CH_3)_2$), δ 1.293 (d, 12H, $C_6H_4$—$CH(CH_3)_2$), δ 1.021 (d, 12H, $(CH_3)_2CHNC(CH_2CH_3)NCH(CH_3)_2$), δ 0.909 (t, 3H, $(CH_3)_2CHNC(CH_2CH_3)NCH(CH_3)_2$)

<Example 4> Preparation of bis-isopropyl cyclopentadienyl-N,N'-isopropylethylamidinate gadolinium ($^i$PrCp)$_2$Gd[PrNC(Et)N$^i$Pr]

After sodium amide was put into a flame-dried 500-mL Schlenk flask, the flask was maintained at room temperature. After 250 mL of THF and isopropylcyclopentadiene were slowly drop-wise added to the flask, the obtained reaction solution was stirred at room temperature for 20 hours to prepare isopropylcyclopentadienyl sodium.

After 30 g (0.114 mol) of gadolinium(III) chloride and 200 mL of n-hexane ($C_6H_{14}$) were put into a flame-dried 1 L Schlenk flask, the flask was maintained at room temperature. After the synthesized isopropylcyclopentadienyl sodium was slowly drop-wise added to the flask, the obtained reaction solution was stirred at room temperature for 20 hours to prepare a tris(isopropylcyclopentadienyl) gadolinium(III) solution.

After 25.4 g (0.091 mol) of n-butyl lithium (n-BuLi, 23%) and 200 mL of n-hexane ($C_6H_{14}$) were put into a 500 mL flask, 14.2 g (0.091 mol) of N,N'-isopropylpropionimidamide [$(CH_3)_2CHNC(CH_2CH_3)NHCH(CH_3)_2$] prepared in Preparation Example 1 was slowly drop-wise added to the flask. Then, the obtained reaction solution was stirred at room temperature for 3 hours to prepare lithium amidinate.

The synthesized lithium amidinate was slowly drop-wise added to the synthesized tris(isopropylcyclopentadienyl)gadolinium(III) and the mixed solution was refluxed for 20 hours.

After the reaction was completed, the solvent was removed under reduced pressure and distillation was carried out under reduced pressure to obtain 36 g (60.8%) of a yellow liquid compound represented by the following Chemical Formula 5.

[Chemical Formula 5]

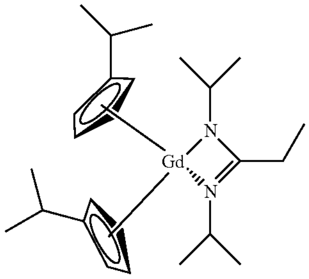

<Comparative Example 2> Preparation of bis-isopropylcyclopentadienyl-N,N'-isopropylmethylamidinate yttrium ($^{i}$PrCp)$_2$Y[$^{i}$PrNC(Me)N$^{i}$Pr]

Bis-isopropylcyclopentadienyl-N,N'-isopropylmethylamidinate yttrium ($^{i}$PrCp)$_2$Y[$^{i}$PrNC(Me)N$^{i}$Pr] was prepared by the same method as in Example 3 except that N,N'-isopropylmethylamidine substituted with methyl instead of ethyl was used.

<Test Example 1> Viscosity Comparison Among Precursor Compounds

The viscosity of the known precursor compound ($^{i}$PrCp)$_2$Y($^{i}$Pr—N—C(Me)=N—$^{i}$Pr) of Comparative Example 2 was compared to the viscosities of the precursor compound ($^{n}$PrCp)$_2$Y($^{i}$Pr—N—C(Et)=N—$^{i}$Pr) of Example 1 and the precursor compound ($^{n}$PrCp)$_2$Gd($^{i}$Pr—N—C(Et)=N—$^{i}$Pr) of Example 2 of the present disclosure as shown in [Table 1] below. The viscosity of the precursor compound ($^{i}$PrCp)$_2$Y($^{i}$Pr—N—C(Me)=N—$^{i}$Pr) (Comparative Example 2) containing N,N'-isopropyl-methylamidinate ($^{i}$Pr—N—C(Me)=N—$^{i}$Pr) ligand was measured as 81 cP, but the viscosities of the precursor compounds ($^{n}$PrCp)$_2$Y ($^{i}$Pr—N—C(Et)=N—$^{i}$Pr) (Example 1) and ($^{n}$PrCp)$_2$Gd ($^{i}$Pr—N—C(Et)=N—$^{i}$Pr) (Example 2) of the present disclosure including N,N'-isopropyl-ethylamidinate ($^{i}$Pr—N—C(Et)=N—$^{i}$Pr) ligand were measured as 69 cP and 68 cP, respectively.

TABLE 1

| Precursor compound | viscosity |
|---|---|
| (Comparative Example 2) ($^{i}$PrCp)$_2$Y[$^{i}$PrNC(Me)N$^{i}$Pr] | 81 cP |
| (Example 1) ($^{n}$PrCp)$_2$Y[$^{i}$PrNC(Et)N$^{i}$Pr] | 69 cP |
| (Example 2) ($^{n}$PrCp)$_2$Gd[$^{i}$PrNC(Et)N$^{i}$Pr] | 68 cP |

When an ALD or CVD precursor in a container is heated and vaporized, if the precursor has a low vapor pressure and a high viscosity, the precursor may remain in a gas supply pipe or a dead space in a valve. When the ALD or CVD precursor is injected in a liquid state into a flash evaporator heated to a high temperature and instantaneously vaporized, if the viscosity is high, clogging easily occurs in the evaporator. Also, a liquid with a too high viscosity cannot be used in a liquid metering pump that transports a liquid.

If it is necessary to lower the viscosity of a liquid that can be used in a pump that transports a liquid in an ALD or CVD apparatus using a liquid transport apparatus and a flash evaporator, for example, if it is necessary to keep it below 9 cP, it is necessary to lower the viscosity by mixing a liquid (solvent) with a low viscosity with a precursor with a high viscosity. When a large amount of the low-viscosity liquid is mixed, the precursor content becomes relatively low in the low-viscosity mixture, and when liquids of same volume are vaporized, the amount of precursor gas supplied is reduced. Therefore, when it is necessary to adjust the viscosity, it is preferable to mix a small amount of the low-viscosity liquid. The precursor compounds according to Example 1 and Example 2 of the present disclosure have a lower viscosity than the conventionally known precursor of Comparative Example 2 and thus are more suitable for use as an ALD or CVD precursor.

The octane mixing ratios required to adjust the viscosity of the mixture to 8.5±0.5 cP using octane as a low-viscosity liquid (solvent) are shown in Table 2 below and FIG. 1. According to Table 2 and FIG. 1, the precursor compounds of Example 1 and Example 2 can lower the viscosity of the mixture to 8.5±0.5 cP even when mixed with a less amount of octane than the precursor compound of Comparative Example 2.

TABLE 2

| Precursor compound | octane mixing ratios required to adjust the viscosity to 8.5 ± 0.5 cP |
|---|---|
| (Comparative Example 2) ($^{i}$PrCp)$_2$Y[$^{i}$PrNC(Me)N$^{i}$Pr] | 18~19 wt % |
| (Example 1) ($^{n}$PrCp)$_2$Y[$^{i}$PrNC(Et)N$^{i}$Pr] | 16~17 wt % |
| (Example 2) ($^{n}$PrCp)$_2$Gd[$^{i}$PrNC(Et)N$^{i}$Pr] | 16~17 wt % |

<Test Example 2> Oxide Film Deposition Characteristics of Yttrium Precursor Compounds Depending on Substrate Temperature An atomic layer deposition (ALD) process was performed using the yttrium precursor compounds prepared by the methods of Example 1 and Example 3. As a reactant gas, $O_3$, which is an oxygen source, was used. First, a silicon wafer was immersed in a piranha solution, in which sulfuric acid ($H_2SO_4$) and hydrogen peroxide ($H_2O_2$) were mixed at a ratio of 4:1 ratio, for 10 minutes and taken out and then immersed in a dilute HF aqueous solution for about 2 minutes to remove an oxide film on the silicon surface. Then, an yttrium oxide thin film was prepared by atomic layer deposition (ALD).

Figure 2:
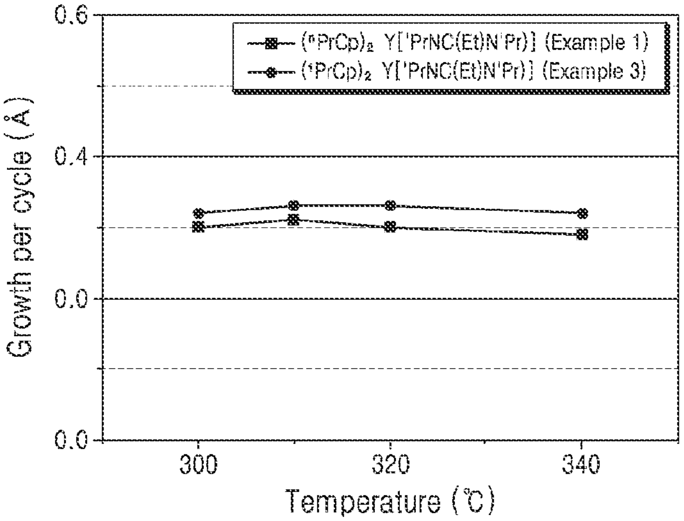
FIG. 2 is a graph showing the growth per ALD gas supply cycle of precursor compounds according to Example 1 and Example 3 of the present disclosure depending on the substrate temperature.

In order to measure the deposition characteristics depending on the substrate temperature, an ALD process was performed by heating the substrate to temperatures of 300° C., 310° C., 320° C. and 340° C. Yttrium precursor compounds were used after heated to a temperature of 150° C. in a stainless steel container. Here, the process pressure of an ALD reactor was maintained at 1 torr. An yttrium precursor compound gas was supplied into the ALD reactor by allowing an argon (Ar) gas to pass through the stainless steel container containing an yttrium precursor compound at a flow rate of 300 sccm. An yttrium oxide film was deposited at each substrate temperature by repeating 100 times an ALD gas supply cycle including the supply of an yttrium precursor for 3 seconds, purging for 10 seconds, the supply of $O_3$ for 10 seconds and purging for 5 seconds. The growth per ALD gas supply cycle (GPC), which was found by measuring the thicknesses of the oxide film, depending on the substrate temperature was shown in FIG. 2. Both of the yttrium precursors of Example 1 and Example 3 showed a constant GPC of about 0.3 Å/cycle in a temperature range of from 300° C. to 340° C.

If the GPC is constant in a wide temperature range, the thickness of a deposited film is constant despite changes in temperature, which is advantageous when ALD is applied to the manufacture of semiconductors. As semiconductor devices continue to be miniaturized, the thickness of a dielectric film of a DRAM capacitor becomes thinner, and it is necessary to form a film having a uniform thickness in a wide temperature range. Therefore, as can be seen from FIG. 2, since the GPC of the yttrium precursors of Example 1 and Example 3 of the present disclosure is constant in a wide temperature range, it is more suitable for depositing an yttrium oxide ($Y_2O_3$) that needs to be finely controlled to have a uniform thickness in an ALD process than a conventional yttrium precursor whose GPC is not constant as temperature changes.

Figure 3:
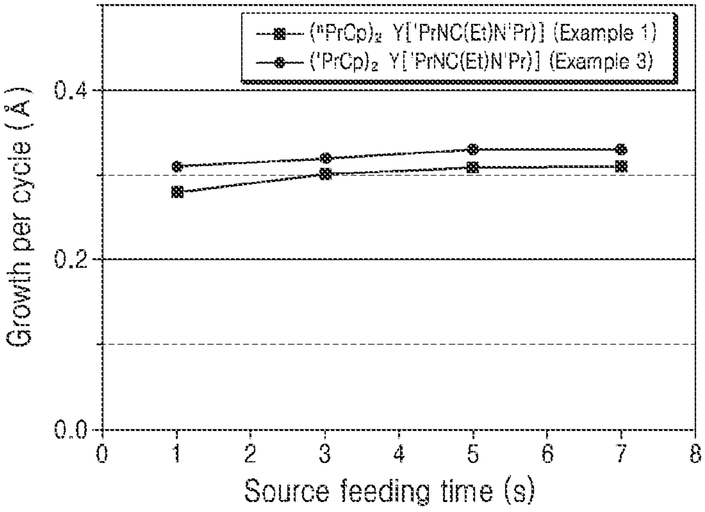
FIG. 3 is a graph showing the growth per ALD gas supply cycle of precursor compound according to Example 1 and Example 3 of the present disclosure depending on the precursor supply time.

<Test Example 3> Oxide Film Deposition Characteristics of Yttrium Precursor Compounds Depending on Precursor Supply Time An yttrium oxide film was prepared under the same conditions as in Test Example 2 except that the substrate temperature was fixed at 300° C. and the yttrium precursor supply time in the ALD gas supply cycle repeated 100 times was changed to 1 second, 5 seconds and 7 seconds instead of 3 seconds, and the GPC obtained by measuring the film thicknesses is shown in FIG. 3. Under ideal ALD conditions, the GPC remains constant even when the precursor supply time is increased. When ALD is performed at a temperature at which the precursor compound is not thermally stable, the film thickness increases as the precursor supply time is increased.

It can be seen from FIG. 3 that the GPC of both of the yttrium precursors of Example 1 and Example 3 was constant at the precursor supply time of 3 seconds or more. In order to form a film with a uniform thickness on a semiconductor DRAM capacitor having a very large aspect ratio (50 or more), there is a need for a precursor that does not increase the film thickness even if the precursor supply time is increased. If it is necessary to increase the precursor supply time in order to supply a sufficient amount of the precursor to a substrate which has a high aspect ratio and thus has a larger actual surface area than the apparent surface area, the use of a precursor that increases the film thickness as the precursor supply time is increased cannot make it possible to form a film with the same thickness on the top and the bottom of a groove having a high aspect ratio. Therefore, as can be seen from FIG. 3, since the yttrium precursors of Example 1 and Example 3 of the present disclosure do not increase the film thickness even if the precursor supply time is increased, they are more suitable for forming a film with a uniform thickness on a structure having a high aspect ratio than a conventional yttrium precursor that increases the film thickness as the precursor supply time is increased, and can be used to form a semiconductor DRAM capacitor.

The above description of the present disclosure is provided for the purpose of illustration, and it would be understood by a person with ordinary skill in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A method of forming an yttrium containing film, comprising:

forming an yttrium containing film using the precursor composition comprising an yttrium containing precursor compound represented by the following Chemical Formula I:

$$(R^1Cp)_2M[(CH_3)_2CH{-}N{-}C(CH_2CH_3){=}N{-}CH(CH_3)_2]; \quad \text{[Chemical Formula I]}$$

wherein, in the above Chemical Formula I,

M is Y, $R^1$ is an n-propyl group ($^n$Pr), and the Cp is a cyclopentadienyl group, wherein the yttrium containing precursor compound is a liquid at room temperature.

2. The method of claim 1, wherein the yttrium containing film is deposited by chemical vapor deposition or atomic layer deposition.

3. The method of claim 1, wherein a thickness of the yttrium containing film is 1 nm to 10 μm.

4. The method of claim 1, wherein the yttrium containing film is formed in a temperature range of 100° C. to 500° C.

5. The method claim 1, wherein the yttrium containing film is formed on a substrate including trenches with an aspect ratio of 1 to 100 and a width of 10 nm to 1 μm.

* * * * *